United States Patent
Fredrickson et al.

(10) Patent No.: US 7,509,611 B2
(45) Date of Patent: Mar. 24, 2009

(54) HEURISTIC CLUSTERING OF CIRCUIT ELEMENTS IN A CIRCUIT DESIGN

(75) Inventors: Mark S. Fredrickson, Rochester, MN (US); Glen Howard Handlogten, Rochester, MN (US); Chad B. McBride, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 450 days.

(21) Appl. No.: 11/348,970

(22) Filed: Feb. 7, 2006

(65) Prior Publication Data

US 2007/0186199 A1 Aug. 9, 2007

(51) Int. Cl.
*G06F 17/50* (2006.01)
(52) U.S. Cl. ............ 716/7; 716/2; 716/4; 716/10; 716/18
(58) Field of Classification Search ............... 716/2–5, 716/7–11, 18
See application file for complete search history.

(56) References Cited

U.S. PATENT DOCUMENTS

| | | | |
|---|---|---|---|
| 6,324,678 | B1 | 11/2001 | Dangelo et al. |
| 6,442,743 | B1 | 8/2002 | Sarrafzadeh et al. |
| 6,609,228 | B1 * | 8/2003 | Bergeron et al. ............ 716/2 |
| 6,857,110 | B1 | 2/2005 | Rupp et al. |
| 6,961,916 | B2 | 11/2005 | Sarrafzadeh et al. |
| 7,162,706 | B2 | 1/2007 | Kuang et al. |
| 2002/0138816 | A1 * | 9/2002 | Sarrafzadeh et al. .......... 716/11 |
| 2002/0162086 | A1 | 10/2002 | Morgan |
| 2004/0225984 | A1 | 11/2004 | Tsao et al. |
| 2004/0230931 | A1 | 11/2004 | Barbee et al. |
| 2004/0250226 | A1 | 12/2004 | Lin et al. |
| 2007/0214445 | A1 * | 9/2007 | DeHon et al. .............. 716/10 |
| 2008/0104564 | A1 | 5/2008 | Lin et al. |

FOREIGN PATENT DOCUMENTS

WO WO0143166 6/2001

OTHER PUBLICATIONS

Kahng A. B., et al., "Practical Bounded-Skew Clock Routing", Journal of VLSI Signal Processing Systems for Signal, Image, and Video Technology, Jun. 1997, pp. 199-215, vol. 16, No. 2/3, Sprinter, New York, NY, USA.
Mike Wright, "Experiments with a Plateau-Rich Solution Space", MIC 2001, 4th Metaheuristics International Conference, Jul. 2001, pp. 317-320, Portugal.
Yip, K. "Clock Tree Distribution", IEEE Potentials, IEEE, Apr. 1997, pp. 11-14, vol. 16, No. 2, New York, NY, USA.
Bonhomme Y., et al., "Design of Routing-Constrained Low Power Scan Chains", Electronic Design, Test and Applications, Second IEEE International Workshop on Perth Australia, Jan. 2004, pp. 1-6, Piscataway, NJ, USA.
Liyang Lai, et al., "Logic BIST with Scan Chain Segmentation", 2004 International Conference on Charlotte, NC, Oct. 26, 2004, pp. 57-66, Piscataway, NJ, USA.

(Continued)

*Primary Examiner*—Paul Dinh
(74) *Attorney, Agent, or Firm*—Wood, Herron & Evans (57) ABSTRACT

An apparatus, program product and method utilize heuristic clustering to generate assignments of circuit elements to clusters or groups to optimize a desired spatial locality metric. For example, circuit elements such as scan-enabled latches may be assigned to individual scan chains using heuristic clustering to optimize the layout of the scan chains in a scan architecture for a circuit design.

12 Claims, 6 Drawing Sheets

OTHER PUBLICATIONS

Berthelot D., et al., "An Efficient Linear Time Algorithm for Scan Chain Optimization and Repartitioning", Proceedings International Test Conference 2002, pp. 781-787, Baltimore, MD, USA.

Dong-Sup Song et al., "Increasing Embedding Probabilities of RPRPs in RIN Based BIST", pp. 600-613, 2005, Springer Berlin Heidelberg.

* cited by examiner

HEURISTIC CLUSTERING OF CIRCUIT ELEMENTS IN A CIRCUIT DESIGN

CROSS-REFERENCE TO RELATED APPLICATIONS

This application is related to U.S. Ser. No. 11,348,907, entitled "TRADING PROPENSITY-BASED CLUSTERING OF CIRCUIT ELEMENTS IN A CIRCUIT DESIGN" (ROC920050437US1), and U.S. Ser. No. 11/348,877, entitled "AUTOMATIC BACK ANNOTATION OF A FUNCTIONAL DEFINITION OF AN INTEGRATED CIRCUIT DESIGN BASED UPON PHYSICAL LAYOUT" (ROC920050451US1), both filed on even date herewith, which applications are incorporated by reference herein.

1. Field of the Invention

The invention relates to computers and computer software, and in particular, to computer software used in integrated circuit device design.

2. Background of the Invention

Integrated circuit devices, commonly known as chips, continue to become more powerful and complex as semiconductor manufacturing technologies have advanced. Whereas early integrated circuit devices included fewer than one hundred transistors, it is now common to integrate millions of transistors into a single integrated circuit device. This increased transistor count enables some operations that once required several integrated circuit devices to now be implemented in a single integrated circuit device, often providing greater performance at a lower cost. For example, where previously a data processing system might require separate integrated circuit devices for a microprocessor, a memory, a bus interface, and a memory controller, advances in chip density now permit all of these functions to be integrated into the same integrated circuit device. Such devices are typically known as "systems on a chip" due to the high level of integration they provide.

Increases in chip density have also significantly affected the design methodologies used for integrated circuit chips. Rather than manually laying out individual transistors or logic gates in a design to obtain a desired logic function, typically the functional aspects of the design process are separated from the physical aspects. The functional aspects of a design are typically addressed via a process known as a logic design, which results in the generation of a functional definition of a circuit design, typically defined in a hardware description language (HDL) such as VHDL or Verilog. An HDL representation of a circuit is analogous in many respects to a software program, as the HDL representation generally defines the logic or functions to be performed by a circuit design. Moreover, by separating logic design from physical layout, functions are capable of being defined at a higher level of abstraction.

In parallel with the creation of the HDL representation, a physical definition of a circuit design is created typically via a layout process, often referred to as integration, to essentially create a "floor plan" of logic gates and interconnects between the logic gates representing the actual physical arrangement of circuit elements on the manufactured integrated circuit. Automation tools have been developed to utilize predefined cells or blocks of complete circuits to assist with the layout, thus eliminating the need to work with millions of individual logic gates. For example, synthesis tools have been developed to generate Random Logic Macro (RLM) blocks from an HDL representation of a design, whereby an individual laying out a design is merely required to place the RLM blocks and connect them to one another to complete the circuit design. In addition, some designs incorporate blocks from off-the-shelf (OTS) logic blocks, which are reusable from design to design.

Once a physical definition is created, testing and simulation of the design may be performed to identify any potential timing and/or manufacturability issues, and once the design has been determined to meet these requirements, the design may be utilized to manufacture integrated circuits.

As integrated circuits have become more complex, the number of individuals involved in the development and testing processes has increased substantially. Indeed, in many instances the individuals performing the logic design process are completely separate from the integrators who perform the physical design processes. Furthermore, as integrated circuits have become more complex, larger and faster, timing issues become more pronounced, often necessitating the functional definition of a design to be revised after layout has been performed. In many instances, several iterations of reworking a functional definition, updating the physical definition, and retesting the physical definition may be required before timing issues are adequately resolved. With different individuals participating in these different processes, therefore, coordinating the updates to the functional and physical definitions can become problematic and time consuming.

One particular area, for example, where the layout process may require revision of a functional definition is associated with what is referred to herein as overhead logic, i.e., supplemental support circuitry that is not directly involved in the primary logic implemented by a circuit design. For example, in order to provide testability for a manufactured device, most integrated circuit designs include a scan architecture integrated therein with one or more serial chains of latches referred to as scan chains. The latches in a serial chain, or scan path, are designed such that, when configured in a specific mode, the latches together operate as a shift register so that data may be shifted into the chain of latches from a single source to simulate different conditions, and so that data generated within a device may be shifted out through a single output. Thus, with a scan architecture, the current state of various nodes in a device at any given time may be controlled and/or recorded and later accessed via external equipment to verify the operation of a manufactured device.

The latches in a scan chain are coupled together serially, typically with each latch having a scan in port and a scan out port, with the scan in port of each latch being connected to the scan out port of its preceding latch. Whereas less complex circuit designs might include tens or hundreds of latches in a single scan chain, more complex designs, e.g., many SOC designs, may require thousands of latches in a scan architecture. Furthermore, to ensure that the amount of time required to load and unload data into and out of a scan architecture, multiple scan chains are typically used, requiring each latch to be assigned to a specific scan chain, in addition to being assigned to a specific location in the selected scan chain.

Scan architectures may require additional clock control signals to be distributed to the various latches to enable and otherwise configure scan chain operation. With more complex integrated circuit designs, the size and timing constraints imposed on the designs often necessitate the use of distribution trees to distribute clock control signals and other overhead or non-overhead global signals. In a distribution tree, signals are distributed via a tree of latches that repower the signals, shorten effective wire lengths, and reduce fanout issues, while ensuring that the signals arrive at all endpoints at the same time. As a result, similar to the assignment of latches to scan chains, latches are often required to be connected to appropriate signals output from a distribution tree.

As a general design rule, it is desirable to utilize multiple balanced scan chains to reduce the length of each scan chain and thus reduce the amount of time required to test a circuit. Furthermore, it is often desirable to minimize the wire lengths used to connect the latches in a scan chain together, which is typically accomplished by grouping latches that are physically located in close proximity to one another into the same scan chain.

It is often desirable to maintain the assignments of latches to scan chains and distribution trees in a functional definition of a circuit design. With layout performed after logic design, however, the optimal assignment of latches to scan chains, as well as the assignment of latches to signal distribution trees, cannot be ascertained until after the design has been laid out. Often, a logic designer is required to initially connect latches to scan chains and distribution trees manually and based upon little more than educated guessing. Often, as a result of layout and testing, the latch connections must be modified manually to reduce wire lengths and achieve timing requirements. Given the iterative nature of the design process, repeated manual modifications may be required. This, in turn, makes it difficult to freeze the functional definition because the functional definition is dependent on layout changes and visa versa.

With large device integration, maintaining proper assignments becomes significantly problematic. For example, when a register (i.e., a group of latches) is physically moved any significant distance during integration, it often must be connected to a different node of a distribution tree and must be placed into a new position of a (possibly different) scan ring. A typical IP block may have dozens of registers (and as a result, hundreds of latches), each requiring separate distribution tree and scan chain assignments to be made. Some design sizes may yield on the order of 150 different distribution tree signals to choose from depending on the physical location of a register, and may incorporate 25 or more separate scan rings. As a result, the management of assignments can be a significant endeavor.

Increasing device frequencies typically drive more placement instabilities into a design, forcing integrators to make frequent changes to a device's floor plan. Since the connections to the scan architecture are not really a part of the functional logic, these changes are usually made without regard for the consequences on the scan architecture. Thus, the management of scan architecture connections, as well as those to other overhead circuitry in a circuit design, continues to increase in difficulty.

SUMMARY OF THE INVENTION

The invention addresses these and other problems associated with the prior art by providing in one aspect an apparatus, program product and method that utilize heuristic clustering to generate assignments of circuit elements to clusters or groups to optimize a desired spatial locality metric. For example, embodiments consistent with the invention may be used to assign circuit elements such as scan-enabled latches to individual scan chains to optimize the layout of the scan chains in a scan architecture for a circuit design.

Consistent with the invention, for example, circuit elements in a circuit design may be clustered by grouping a plurality of circuit elements in a circuit design into a plurality of size balanced clusters, and heuristically optimizing a spatial locality metric for the plurality of circuit elements. The heuristic optimization may be performed by iteratively performing a swap of circuit elements between clusters among the plurality of clusters, recalculating the spatial locality metric after performing the swap, and selectively discarding the swap based upon the recalculated spatial locality metric.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments discussed hereinafter utilize a heuristic clustering algorithm to generate assignments of circuit elements to clusters or groups to optimize a desired spatial locality metric for the circuit design. For example, the herein-described embodiments utilize heuristic clustering to assign scan-enabled latches to individual scan chains in the scan architecture for a circuit design to optimize the wire lengths in the scan chains and thus minimize layout and timing issues.

Furthermore, heuristic clustering may be used in the herein-described embodiments to enable circuit elements defined in a functional definition of a circuit design to be automatically connected with or assigned to overhead circuitry such as scan architecture circuitry after the functional definition of the circuit design has been created and the circuit elements in the design have been laid out into a floor plan to create a physical definition, thus allowing a logic designer to address functional issues in a circuit design without devoting as much attention to issues raised by the overhead circuitry during the development of the functional definition.

In addition, as described in more detail in the aforementioned cross-referenced application entitled "AUTOMATIC BACK ANNOTATION OF A FUNCTIONAL DEFINITION OF AN INTEGRATED CIRCUIT DESIGN BASED UPON PHYSICAL LAYOUT," the assignments of circuit elements to clusters, e.g., the assignment of latches to scan chains, may be utilized in a back annotation process to automatically back annotate the functional definition of the circuit design with the circuit element assignments generated via heuristic clustering.

A functional definition within the context of the invention may be implemented, for example, using any number of hardware definition language (HDL) formats, e.g., VHDL, Verilog, etc., and represents all or a portion of the components and connectivity therebetween to implement the desired logic in an integrated circuit device, which may be independent of physical layout. A physical definition may be implemented, for example, as one or more netlist files, and represents the physical layout of all or a portion of the circuit design.

Circuit elements may alternately be referred to herein as cells or components, and it will be appreciated that a circuit element may incorporate circuitry with varied levels of complexity and abstraction, e.g., as small as a single logic gate or as large as a complex IP block containing hundreds or thousands of logic gates. Embodiments consistent with the invention effectively group some or all of the circuit elements in a circuit design into clusters or groups, and it will be appreciated that the principles of the invention may be applied to most if not all circuit elements for which it may be desirable to cluster for geographic-based reasons.

To implement heuristic clustering consistent with the invention, circuit elements are initially grouped into size balanced clusters, i.e., clusters having exactly or approximately the same number of members. Desired centroids are defined for each cluster, representing a desired geographical location for each cluster in the layout of the circuit design. In the illustrated embodiment discussed below, the desired centroid for each cluster is defined along a single dimension, i.e., along a vertical axis for a circuit design. In other embodiments, however, desired centroids may be established in two or more dimensions. Desired centroids may be defined manually or automatically, and in some implementations, it may be desirable to adjust or modify desired centroids to improve clustering.

Once a desired centroid is defined for each cluster, heuristic clustering may be performed to selectively swap circuit elements singularly or in groups between clusters to improve the spatial distribution of the clusters, e.g., to make each cluster as spatially compact as possible.

The manner in which the spatial distribution of each cluster is measured in the illustrated embodiments is via the measurement of a spatial locality metric. In the embodiments described hereinafter, where each desired centroid is defined in a single dimension, a spatial locality metric may be calculated for each cluster as a sum of the vertical distances between the desired centroid and each circuit element assigned to the cluster (e.g., a center or an edge of each circuit element). In other embodiments, however, other spatial locality metrics may be used. For example, where desired centroids are defined in two dimensions, desired centroids may utilize the two dimensional distance from each circuit element to a cluster centroid point, e.g., as based upon manhattan distance (sum of vertical and horizontal distances), or based upon the shortest distance between the two points (i.e., "as the crow flies"). Spatial locality metrics may also be based upon only a subset of circuit elements in a cluster, or may also take into account "mass", e.g., factoring in the relative size of each circuit element into the calculation. Spatial locality metrics may also be based upon an overall calculation representing the spatial distribution of all of the clusters. Practically any metric that can be used to define the spatial distribution of clusters, as thus the level of geographic optimization of a cluster, may be used as a spatial locality metric consistent with the invention.

Heuristic clustering consistent with the invention optimizes the spatial locality metric for one or more clusters by iteratively and repeatedly performing swaps of one or more circuit elements between two or more clusters, recalculating the spatial locality metric, and discarding, e.g., negating or undoing, any swaps that do not improve the spatial locality metric. Such iterative and repeated random swaps are typically performed until a desired endpoint is reached, e.g., after a preset number of iterations, after a preset number of iterations without a successful swap, etc.

It will be appreciated that whether a swap improves a spatial locality metric may be interpreted differently in different embodiments. For example, a spatial locality metric may be deemed not improved if the metric does not change, if the metric does not improve beyond a threshold, or if the metric in fact gets worse.

It will also be appreciated that performing a swap and negating a swap after recalculating the spatial locality metric does not necessarily require that circuit elements be reassigned to different clusters, i.e., assigned to another cluster prior to recalculating the spatial locality metric, and reassigned back to the original cluster if the metric is not improved. In some embodiments, the performance of a swap may incorporate only the selection of circuit elements to be swapped for the purpose of recalculating the spatial locality metric with the assumption that such circuit elements were already assigned to new clusters, whereby an assignment to new clusters would be required after determining that an improvement has been achieved, and discarding would require only the omission of such an assignment upon determining that no improvement was achieved. In other embodiments, however, performing a swap and discarding a swap may also incorporate assigning and reassigning circuit elements to different clusters.

The discussed hereinafter describe the assignment of scan-enabled latches to scan chains; however, it will be appreciated that the heuristic clustering algorithm discussed herein may be used to assign scan-enabled latches as well as other types of circuit elements to different types of clusters, e.g., to facilitate the distribution of global signals such as functional signals or clock control signals to various circuit elements. In this regard, a global signal may be considered to incorporate any signal that is shared across multiple units or partitions of a circuit design using a distribution tree. A global signal assignment typically assigns a latch or other circuit element to a particular endpoint in the distribution tree that distributes a particular global signal.

Figure 1:
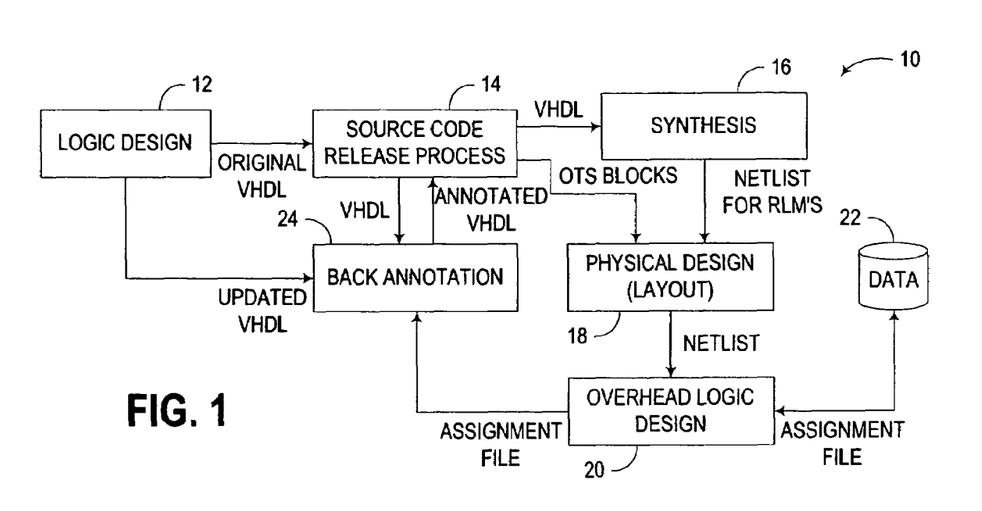
FIG. 1 is a block diagram of an integrated circuit design process incorporating heuristic clustering consistent with the invention.

Turning now to the Drawings, wherein like numbers denote like parts throughout the several views, FIG. 1 illustrates an exemplary integrated circuit design process 10 suitable for implementing heuristic clustering consistent with the invention. The design process typically begins with logic design, as shown in block 12, which is typically performed by one or more logic designers using logic design tools, and which results in the generation of a functional definition, e.g., in the form of one or more VHDL files. The VHDL files are typically, but not necessarily, provided to a source code release process 14, which maintains version control over the VHDL files.

From the VHDL files, one or more synthesis tools, e.g., various placement-based or timing-based synthesis tools, may be used to generate netlist files for Random Logic Macros (RLM's) from some or all of the VHDL files. These files are in turn used by one or more integrators in a physical design or layout process 18 to generate a floor plan for the circuit design. The floor plan may be represented, for example, using one or more netlist files, or using other manners of representing physical definitions of a circuit design. In addition to or in lieu of automated synthesis, some or all of the functional definition may be implemented using a custom or semi-custom design style using OTS blocks which may be maintained by source code release process 14, and which may be used by integrators during physical design 18 when generating a floor plan for the circuit design.

From the physical definition, represented in netlist format, an overhead logic design process 20 may be used to generate an assignment file including assignments between circuit elements and various signals associated with the overhead logic in the circuit design, e.g., related to the scan architecture. The assignment file may be stored in a database 22, and prior versions of the assignment file may be retrieved from database 22 in connection with generating the assignments in process 20. Process 20 may also be used to generate assignments for other global signals, e.g., functional signals distributed via distribution trees. It is within overhead logic design process 20 that heuristic clustering is implemented in process 10 to assign scan-enabled latches to scan chains in the circuit design.

The assignment file generated by process 20 may then be used to back annotate the functional definition of the circuit design as shown in block 24. In particular, back annotation process 24 may be used to annotate the VHDL files generated by logic design process 12 with assignments defined in the assignment file. The annotated files are then provided to the source code release process 14 for retention. It will be appreciated that an assignment file may be implemented using any suitable data structure.

It will be appreciated that, using the process illustrated in FIG. 1, assignments made as a result of physical layout may be propagated back into the source VHDL generated by the logic design. Furthermore, modifications made to the physical layout at a later time may also be back annotated to the source VHDL. As also illustrated in FIG. 1, modifications to the functional definition of the circuit design, as shown by the arrow from block 12 to block 24, may also be used to annotate the functional definition of the circuit design. A more detailed discussion of back annotation is provided in the aforementioned cross-referenced application.

It will be appreciated that other design processes and methodologies may be utilized in different embodiments of the invention. Moreover, it will be appreciated that various operations within the process may be performed manually or in an automated fashion with the assistance of a computer-implemented tool. It will also be appreciated that back annotation may be performed using an assignment file generated in a manner other than that described herein in connection with overhead logic design process 20. Furthermore, manual back annotation may be used in some embodiments in addition to or in lieu of the automated process described herein. The invention is therefore not limited to the specific embodiments described herein.

Figure 2:
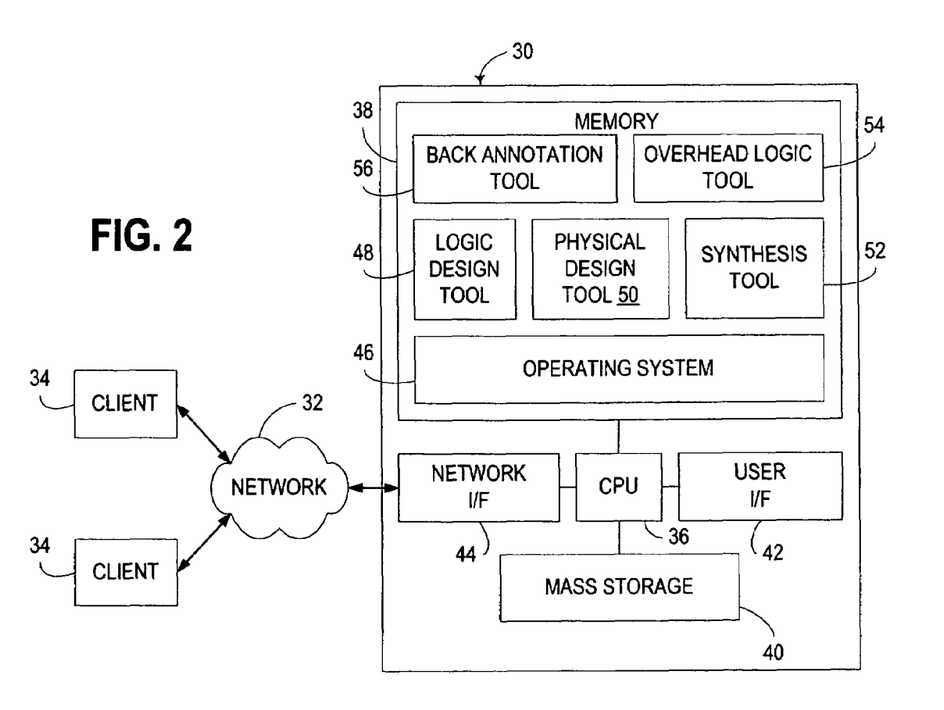
FIG. 2 is a block diagram of the principal hardware components in a computer system suitable for implementing the process of FIG. 1.

FIG. 2 next illustrates an apparatus 30 within which the various steps in process 10 may be performed. Apparatus 30 in the illustrated embodiment is implemented as a server or multi-user computer that is coupled via a network 32 to one or more client computers 34. For the purposes of the invention, each computer 30, 34 may represent practically any type of computer, computer system or other programmable electronic device. Moreover, each computer 30, 34 may be implemented using one or more networked computers, e.g., in a cluster or other distributed computing system. In the alternative, computer 30 may be implemented within a single computer or other programmable electronic device, e.g., a desktop computer, a laptop computer, a handheld computer, a cell phone, a set top box, etc.

Computer 30 typically includes a central processing unit 36 including at least one microprocessor coupled to a memory 38, which may represent the random access memory (RAM) devices comprising the main storage of computer 30, as well as any supplemental levels of memory, e.g., cache memories, non-volatile or backup memories (e.g., programmable or flash memories), read-only memories, etc. In addition, memory 38 may be considered to include memory storage physically located elsewhere in computer 30, e.g., any cache memory in a processor in CPU 36, as well as any storage capacity used as a virtual memory, e.g., as stored on a mass storage device 40 or on another computer coupled to computer 30. Computer 30 also typically receives a number of inputs and outputs for communicating information externally. For interface with a user or operator, computer 30 typically includes a user interface 42 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 30 may also include one or more mass storage devices 40, e.g., a floppy or other removable disk drive, a hard disk drive, a direct access storage device (DASD), an optical drive (e.g., a CD drive, a DVD drive, etc.), and/or a tape drive, among others. Furthermore, computer 30 may include an interface 44 with one or more networks 32 (e.g., a LAN, a WAN, a wireless network, and/or the Internet, among others) to permit the communication of information with other computers and electronic devices. It should be appreciated that computer 30 typically includes suitable analog and/or digital interfaces between CPU 36 and each of components 38, 40, 42 and 44 as is well known in the art. Other hardware environments are contemplated within the context of the invention.

Computer 30 operates under the control of an operating system 46 and executes or otherwise relies upon various computer software applications, components, programs, objects, modules, data structures, etc., as will be described in greater detail below. Moreover, various applications, components, programs, objects, modules, etc. may also execute on one or more processors in another computer coupled to computer 30 via network 32, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

To implement the various activities in process 10 of FIG. 1, computer 30 includes a number of software tools, including, for example, a logic design tool 48, a physical design tool 50, and a synthesis tool 52, as well as a overhead logic tool 54 suitable for performing heuristic clustering consistent with the invention, and a back annotation tool 56 for performing automated back annotation. Other tools utilized in connection with integrated circuit design, verification and/or testing may also be utilized in computer 30. Moreover, while tools 48-56 are shown in a single computer 30, it will be appreciated by one of ordinary skill in the art having the benefit of the instant disclosure that typically these tools will be disposed in separate computers, particularly where multiple individuals participate in the logic design, integration and verification of an integrated circuit design. Therefore, the invention is not limited to the single computer implementation that is illustrated in FIG. 2.

Those skilled in the art will recognize that the exemplary environment illustrated in FIGS. 1 and 2 is not intended to limit the present invention. Indeed, those skilled in the art will recognize that other alternative hardware and/or software environments may be used without departing from the scope of the invention.

Figure 3:
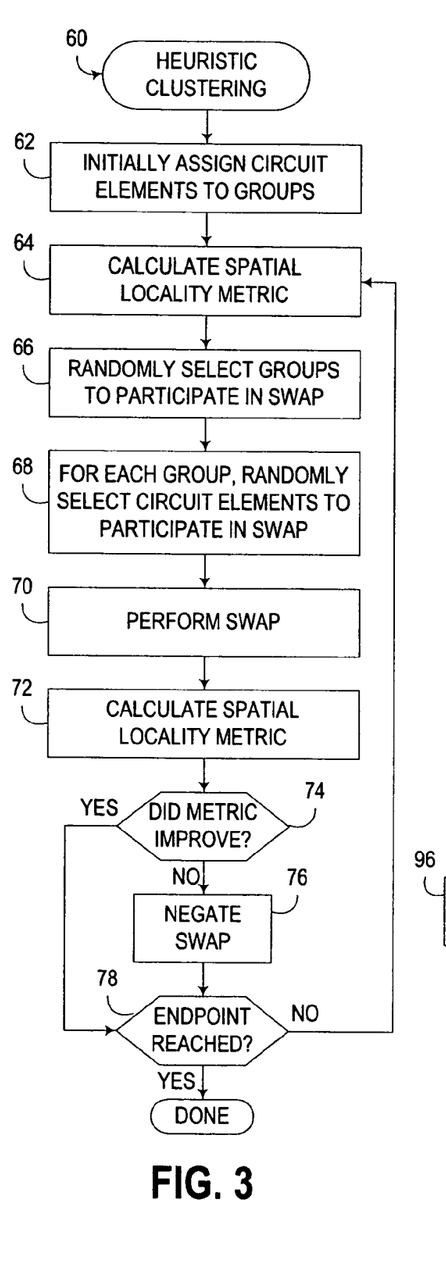
FIG. 3 is a flowchart illustrating the program flow of a heuristic clustering routine capable of being executed by the overhead logic tool referenced in FIG. 2.

Now turning to FIG. 3, an exemplary heuristic clustering routine 60, suitable for grouping circuit elements into clusters to optimize a spatial locality metric, is illustrated. Routine 60 begins in block 62 by initially assigning circuit elements to groups. As noted above, it is desirable to assign circuit elements to form size balanced groups. Furthermore, the assignment may be performed in a number of different manners, e.g., randomly or by attempting to assign the circuit elements sequentially to the closest groups that are not yet full, as described below in greater detail in connection with FIGS. 5 and 6.

Next, in block 64, the desired spatial locality metric is calculated, and in block 66, two or more groups are randomly selected to participate in a swap. Next, in block 68, for each selected group, one or more circuit elements are randomly selected to participate in the swap, typically with the number of circuit elements selected in such a manner as to maintain balanced sizes among the groups after the swap.

Next, in block 70, the swap is performed, whereby the selected circuit elements in each selected group are assigned to another selected group. Block 72 then recalculates the spatial locality metric, and block 74 determines whether the metric improved. If not, control passes to block 76 to discard, or undo, the swap, resulting in the circuit elements that were assigned to different groups during the swap being reassigned to their original groups. Control then passes to block 78 to determine whether the desired endpoint has been reached (e.g., after N iterations, or after N iterations with no successful swap). Returning to block 74, if the metric did improve, control passes to block 78, thus bypassing block 76 and retaining the successful swap.

If block 78 determines that the endpoint has not been reached, control passes to block 64 to recalculate the spatial locality metric and perform another swap. If the endpoint has been reached, however, routine 60 is complete.

Figure 4:
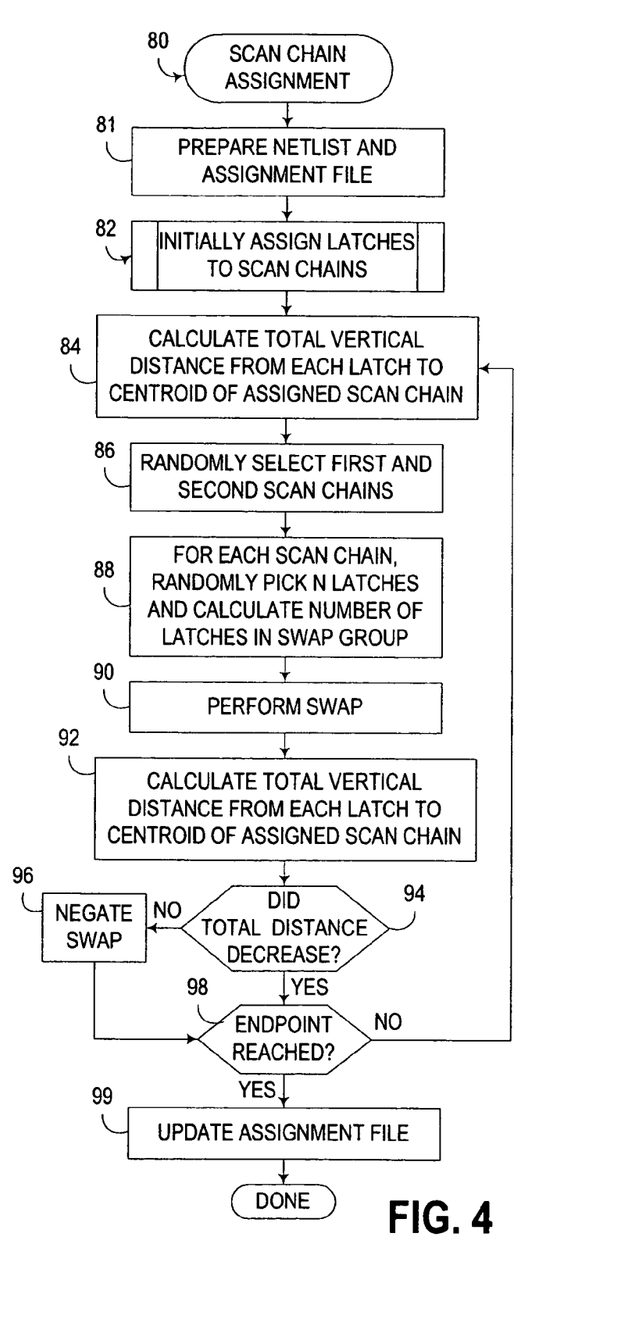
FIG. 4 is a flowchart illustrating the program flow of a scan chain assignment routine utilizing a heuristic clustering algorithm capable of being executed by the overhead logic tool referenced in FIG. 2.

As noted above, the heuristic clustering algorithm described herein may be utilized to cluster different types of circuit elements for different purposes. FIG. 4, for example, illustrates a scan chain assignment routine 80 that may be used to assign scan-enabled latches in a circuit design to different scan chains in the design.

Routine 80 begins in block 81 by preparing netlist and assignment files. Typically, this is performed by first loading into memory the netlist files based upon the most recent layout data for the circuit design. From this netlist data, the position, size and shape of each circuit element may be loaded into a map of the chip. Once all shapes have been loaded into memory, the elements that require connection to a scan chain may be flagged, such that the circuit elements in the design that do not require such connections may be removed from consideration. The inclusion or exclusion of circuit elements may be rule based and may be defined in an assignment file that is also loaded in block 81. The assignment file may include a list of all of the circuit elements in a circuit design and the hierarchical name of each element. The assignment file also contains information about the scan chain and clock control trees to use for each circuit element (e.g., as input by a logic designer during development of the functional design). The assignment file may also contain information about the location of each scan chain in terms of a desired centroid.

Once the netlist and assignment file have been prepared, control passes to block 82 to perform a heuristic clustering algorithm similar to that described above in connection with FIG. 3. Specifically, block 82 initially assigns latches to scan chains. Two implementations of block 82 are described in greater detail below in connection with FIGS. 5 and 6. It will be appreciated that the term "latch" may also refer to similar information storage circuits such as registers and the like. Furthermore, some registers or other circuits may include multiple latches, and as such, the assignment of latches may also constitute the assignment of circuit elements that include one or more latches.

Next, in block 84, the desired spatial locality metric is calculated, which in this implementation incorporates calculating, for each latch, the total vertical distance between the latch and the desired centroid of its assigned scan chain (which in this implementation is defined as a single point along a one dimensional axis). Next, in block 86, first and second scan chains are randomly selected, and then in block 88, N latches are randomly selected from each scan chain to create first and second swap groups. The selection of latches stays within a preset latch count limit, and the total number of latches in each swap group is calculated. Given that some elements may have multiple latches, the number of latches in the two swap groups may not be identical in some embodiments, so long as the total number is approximately equal in order to maintain balanced clusters. As an example, one scan group may include a register with 14 latches, while another may include three registers with 5 latches each.

Next, in block 90, the swap is performed, whereby the selected latches in each selected scan chain are assigned to the other scan chain. Block 92 then recalculates the spatial locality metric, here the total vertical distance from each latch to the desired centroid of the assigned scan chain, i.e., a value associated with the sum of the distances of each latch in each of the scan chains involved in the swap. Block 94 determines whether the metric improved, based upon whether the total distance has decreased. If not, control passes to block 96 to discard, or undo, the swap, resulting in the latches that were assigned to different scan chains during the swap being reassigned to their original scan chains. Control then passes to block 98 to determine whether the desired endpoint has been reached (e.g., after N iterations, or after N iterations with no successful swap). Returning to block 94, if the total distance did decrease, control passes to block 98, thus bypassing block 96 and retaining the successful swap.

If block 98 determines that the endpoint has not been reached, control passes to block 84 to recalculate the total distance and perform another swap. If the endpoint has been reached, however, block 98 passes control to block 99 to update the assignment file and store the updated file. Routine 80 is complete.

Figure 5:
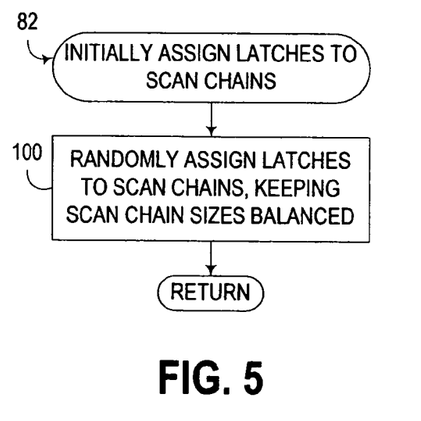
FIG. 5 is a flowchart illustrating the program flow of one implementation of the initially assign latches to scan chains routine referenced in FIG. 4.
Figure 6:
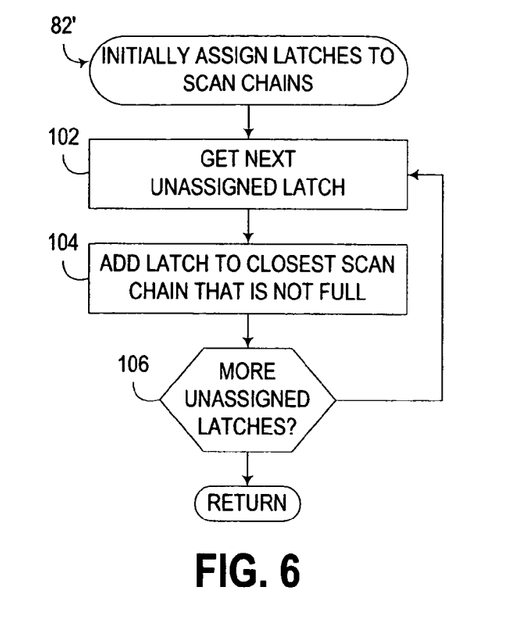
FIG. 6 is a flowchart illustrating the program flow of another implementation of the initially assign latches to scan chains routine referenced in FIG. 4.

FIG. 5 illustrates one implementation of initially assign latches to scan chains block 82 of FIG. 4, which incorporates a step 100 where latches are initially assigned randomly to scan chains so that the scan chain sizes are kept size balanced (i.e., with approximately the same number of members). FIG. 6 illustrates another implementation of initially assign latches to scan chains block 82 of FIG. 4 (designated as routine 82'), which begins in block 102 by getting the next unassigned latch from among the latches awaiting assignment to a scan chain by the heuristic clustering algorithm.

Block 104 then adds the latch to the closest scan chain that is not currently full. The closest scan chain may be determined by calculating the vertical distance from the latch to each scan chain. Moreover, since the scan chains are desirably size balanced, a check is made to determine whether the scan chain has already been filled prior to assigning a latch to its closest scan chain, and selecting another, more distant scan chain as an alternative. The capacity of a scan chain may be determined for example by dividing the number of latches by the number of scan chains.

Control next passes to block 106 to determine whether additional latches await assignment, and if so, control returns to block 102 to assign another latch. Once all latches are assigned, routine 82' is complete.

Figure 7:
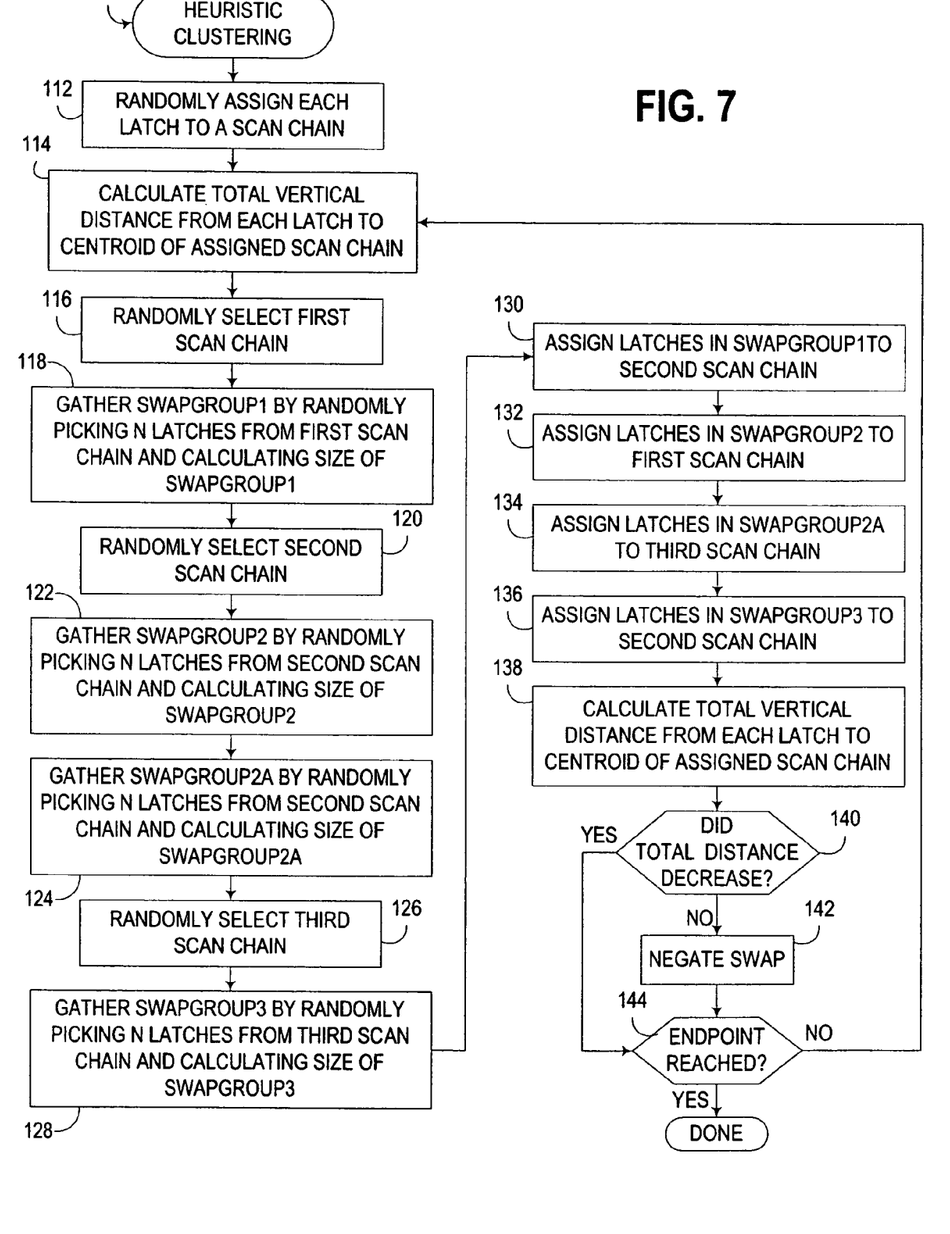
FIG. 7 is a flowchart illustrating the program flow of another heuristic clustering routine capable of being executed by the overhead logic tool referenced in FIG. 2, which supports swapping of latches between three clusters at a time.

FIG. 7 next illustrates another heuristic clustering routine 110 that may be executed in lieu of blocks 82-98 of routine 80 to assign scan-enabled latches to scan chains in a circuit design. In this implementation, rather than creating two swap groups from latches in two scan chains, pipelined swapping is performed, whereby four swap groups are created from three scan chains such that three scan chains participate in a particular swap.

Routine 110 begins in block 112, which initially assigns latches to scan chains via random assignment. In the alternative, the initial assignment described above in connection with routine 82' may be used. Next, in block 114, the desired spatial locality metric is calculated, which in this implementation incorporates calculating, for each latch, the total vertical distance between the latch and the desired centroid of its assigned scan chain (which in this implementation is defined as a single point along a one dimensional axis). Next, in block 116, a first scan chain is randomly selected, and then in block 118, N latches are randomly selected from the first scan chain to create a first swap group, referred to as swapgroup1. The selection of latches stays within a preset latch count limit, and the total number of latches in the swap group is also calculated in block 118.

Next, in block 120, a second scan chain is randomly selected, and then in blocks 122 and 124, two sets of N latches are randomly selected from the second scan chain to create a pair of second swap groups, referred to as swapgroup2 and swapgroup2A. Next, in block 126, a third scan chain is randomly selected, and in block 128, N latches are randomly selected from the third scan chain to create a third swap group, referred to as swapgroup2. In each of blocks 122, 124 and 128, the selection of latches stays within a preset latch count limit, and the total number of latches in the swap group is also calculated. It will be appreciated that if swap groups include circuit elements with multiple latches, the total number of latches assigned to each swap group may vary slightly from one another.

Next, in blocks 130-136, the swap is performed, whereby the selected latches in swapgroup1 are assigned to the second scan chain (block 130), the selected latches in swapgroup2 are assigned to the first scan chain (block 132), the selected latches in swapgroup2A are assigned to the third scan chain (block 134), and the selected latches in swapgroup3 are assigned to the second scan chain (block 136).

Block 138 then recalculates the spatial locality metric, here the total vertical distance from each latch to the desired centroid of the assigned scan chain, i.e., a value associated with the sum of the distances of each latch in each of the scan chains involved in the swap. Block 140 determines whether the metric improved, based upon whether the total distance has decreased. If not, control passes to block 142 to discard, or undo, the swap, resulting in the latches that were assigned to different scan chains during the swap being reassigned to their original scan chains. Control then passes to block 144 to determine whether the desired endpoint has been reached (e.g., after N iterations, or after N iterations with no successful swap). Returning to block 140, if the total distance did decrease, control passes to block 144, thus bypassing block 142 and retaining the successful swap.

If block 144 determines that the endpoint has not been reached, control passes to block 114 to recalculate the total distance and perform another swap. If the endpoint has been reached, however, routine 110 is complete.

It will be appreciated that other manners of assigning latches to different scan chains, rather than from among two or three scan chains as described above in connection with FIGS. 4 and 7, may be used consistent with the invention.

Figure 8:
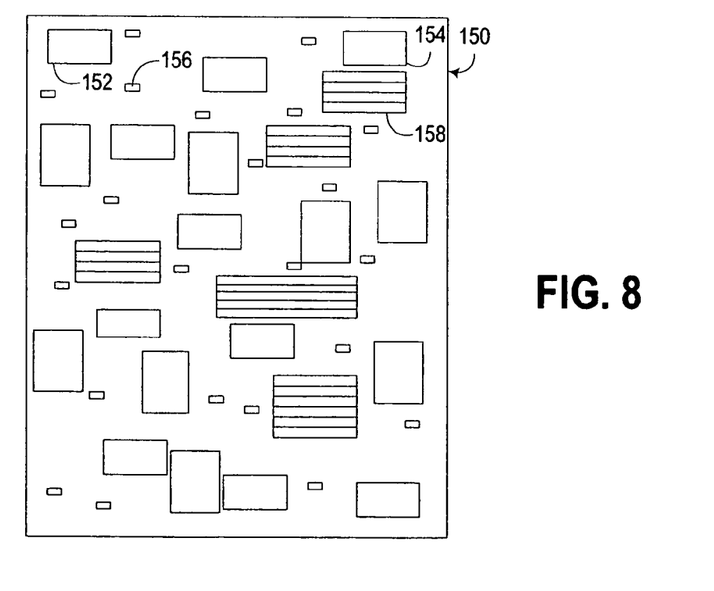
FIGS. 8-12 are block diagrams of an exemplary circuit design, illustrating the operation of the scan chain assignment routine referenced in FIG. 4.

Now turning to FIGS. 8-12, an exemplary circuit design 150, incorporating a plurality of circuit elements that include single scan-enabled latches, is illustrated for the purposes of further describing the operation of the heuristic clustering algorithms described herein, in particular that described above in connection with routine 80 of FIG. 4. FIG. 8, in particular, illustrates circuit elements 152, 154, 156 and 158 that are distributed throughout circuit design 150.

Figure 9:
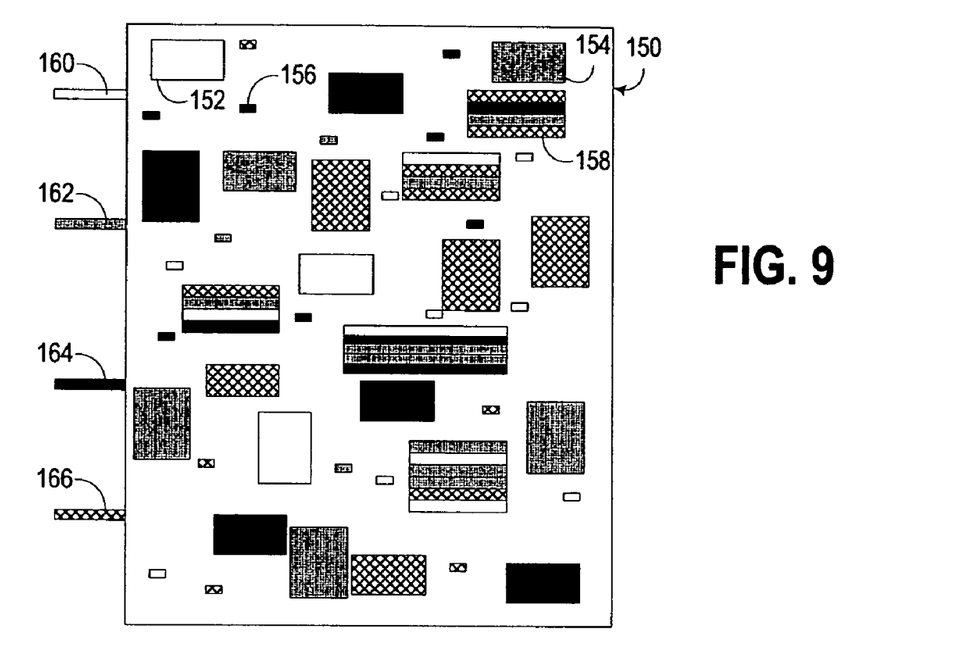

FIG. 9 next illustrates an exemplary initial random assignment of circuit elements to four different scan chains, which scan chains have defined therefor desired centroids 160, 162, 164 and 166, respectively. As illustrated by matching shading, circuit element 152 is initially assigned to the scan chain having desired centroid 160, circuit element 154 is initially assigned to the scan chain having desired centroid 162, circuit element 156 is initially assigned to the scan chain having desired centroid 164, and circuit element 158 is initially assigned to the scan chain having desired centroid 166.

Figure 10:
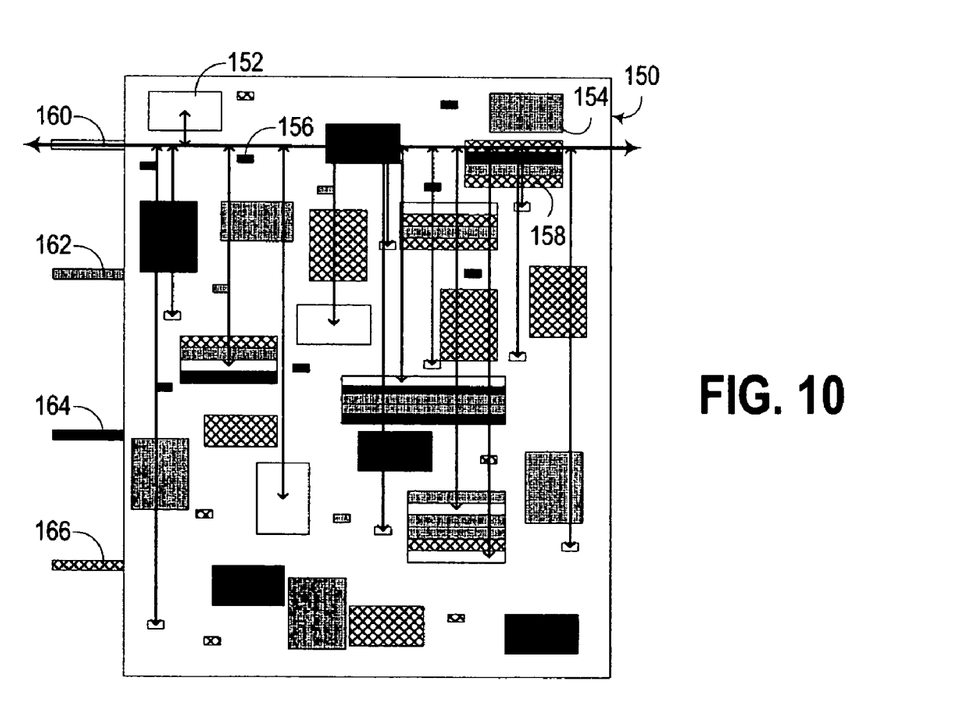

FIG. 10 next illustrates the calculation of the total distance spatial locality metric in block 84 of FIG. 4, for the latches assigned to the scan chain having desired centroid 160. The total distance is the sum of vertical distances between each latch assigned to the scan chain (unshaded in FIG. 10) to desired centroid 160, represented by a horizontal arrow.

Figure 11:
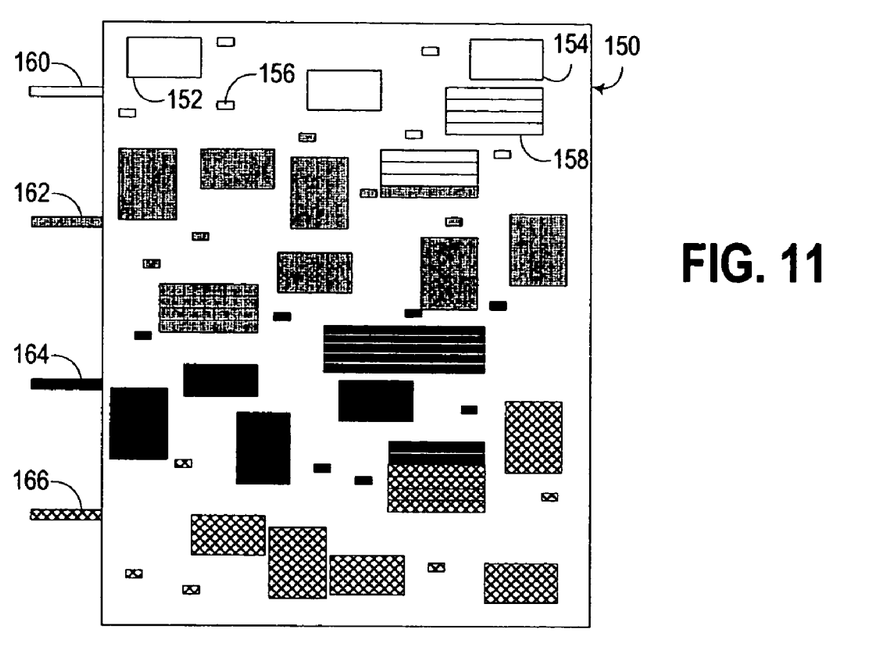
Figure 12:
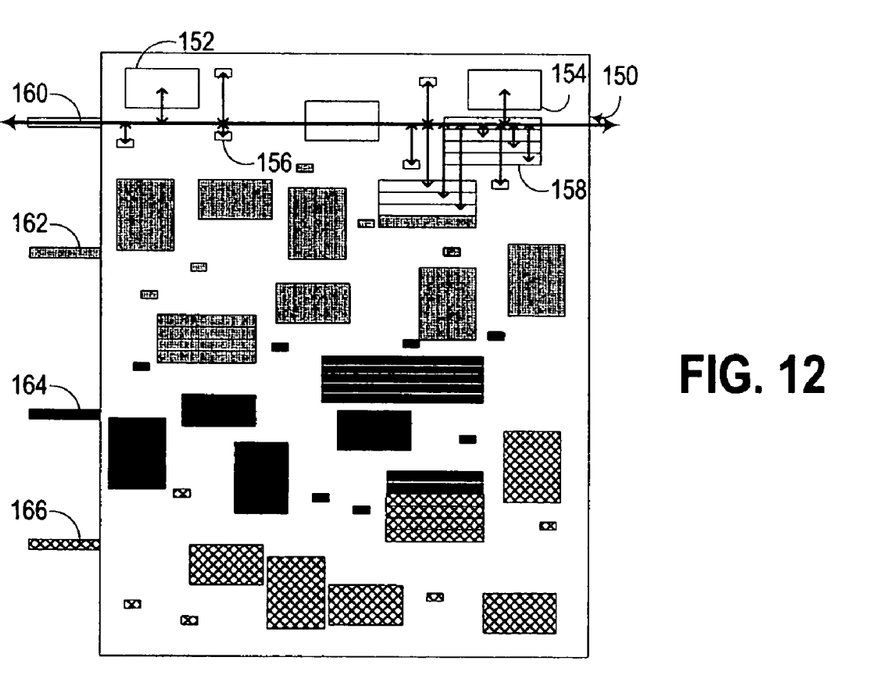

FIG. 11 next illustrates the result of heuristic clustering subsequent to the initial random assignment, typically after numerous iterations of blocks 86-98 of FIG. 4. As can be seen in the figure, latches that are proximate to a particular scan chain centroid are typically clustered into the same scan chain group. In this case, each of latches 152, 154, 156 and 158, being closest to the scan chain having desired centroid 160, are assigned to that scan chain. As shown in FIG. 12, the total distance of all of the latches assigned to the scan chain (unshaded in FIG. 12) is substantially reduced as compared to after the random assignment illustrated in FIG. 10.

Various modifications may be made to the illustrated embodiments without departing from the spirit and scope of the invention. For example, rather than calculating the total distance of all elements in a cluster, a calculation may be made of the distances of only the latches involved in a particular swap. Other spatial locality metrics will be appreciated by one of ordinary skill in the art having the benefit of the instant disclosure.

Various additional modifications to the herein-described embodiments will be apparent to one of ordinary skill in the art having the benefit of the instant disclosure. Therefore, the invention lies in the claims hereinafter appended.

What is claimed is:

1. A method of clustering circuit elements in a circuit design, the method comprising:
    grouping a plurality of circuit elements in a circuit design into a plurality of size balanced clusters;
    heuristically optimizing a spatial locality metric for the plurality of circuit elements by iteratively:
        performing a swap of circuit elements between clusters among the plurality of clusters;
        calculating the spatial locality metric after performing the swap; and
        selectively discarding the swap based upon the calculated spatial locality metric; and
    terminating iteration of the heuristic optimization after reaching an endpoint;
wherein each cluster is associated with a desired centroid, wherein the spatial locality metric is based at least in part upon a distance from a circuit element to the desired centroid of a cluster, wherein the desired centroid for each cluster defines a position along an axis defined in a layout of the circuit design, and wherein the spatial locality metric is based at least in part upon a distance from a circuit element to the desired centroid of a cluster along the axis.

2. The method of claim 1, wherein each of the plurality of circuit elements comprises a latch.

3. The method of claim 2, wherein each cluster is associated with a scan chain.

4. The method of claim 2, wherein each cluster is associated with a clock control tree.

5. The method of claim 1, wherein performing the swap includes randomly selecting circuit elements to be involved in the swap while maintaining size balance for each cluster involved in the swap.

6. The method of claim 1, wherein grouping the plurality of circuit elements includes randomly grouping the plurality of circuit elements into the plurality of size balanced clusters.

7. The method of claim 1, wherein grouping the plurality of circuit elements includes grouping the plurality of circuit elements into the plurality of size balanced clusters based upon the position of each circuit element in a layout for the circuit design.

8. The method of claim 1, wherein the spatial locality metric is based upon a sum of the distances of each circuit element in a cluster to the desired centroid of such cluster.

9. The method of claim 1, wherein performing the swap of circuit elements between clusters among the plurality of clusters includes selecting first and second clusters, selecting a group of circuit elements from each of the first and second clusters, assigning the group of circuit elements from the first cluster to the second cluster and assigning the group of circuit elements from the second cluster to the first cluster.

10. The method of claim 1, wherein terminating iteration of the heuristic optimization after reaching the endpoint comprises terminating iteration of the heuristic optimization after a predetermined number of iterations.

11. The method of claim 1, wherein terminating iteration of the heuristic optimization after reaching the endpoint comprises terminating iteration of the heuristic optimization after a predetermined number of iterations without successful swaps.

12. A method of clustering circuit elements in a circuit design, the method comprising:
    grouping a plurality of circuit elements in a circuit design into a plurality of size balanced clusters:
    heuristically optimizing a spatial locality metric for the plurality of circuit elements by iteratively:
        performing a swap of circuit elements between clusters among the plurality of clusters;
        calculating the spatial locality metric after performing the swap; and
        selectively discarding the swap based upon the calculated spatial locality metric; and
    terminating iteration of the heuristic optimization after reaching an endpoint;
wherein performing the swap of circuit elements between clusters among the plurality of clusters includes selecting first, second and third clusters, selecting a group of circuit elements from each of the first and third clusters, selecting a pair of groups from the second cluster, assigning the group of circuit elements from the first cluster to the second cluster, assigning the group of circuit elements from the third cluster to the second cluster, assigning one of the pair of groups of circuit elements from the second cluster to the first cluster and assigning the other of the pair of groups of circuit elements from the second cluster to the third cluster.

* * * * *